US009753693B2

(12) United States Patent
Rose

(10) Patent No.: US 9,753,693 B2
(45) Date of Patent: Sep. 5, 2017

(54) CONSTANT FRACTION INTEGER MULTIPLICATION

(71) Applicant: Imagination Technologies Limited, Kings Langley (GB)

(72) Inventor: Thomas Rose, Watford (GB)

(73) Assignee: Imagination Technologies Limited, Kings Langley (GB)

( * ) Notice: Subject to any disclaimer, the term of this patent is extended or adjusted under 35 U.S.C. 154(b) by 521 days.

(21) Appl. No.: 14/208,591

(22) Filed: Mar. 13, 2014

(65) Prior Publication Data

US 2014/0280410 A1 Sep. 18, 2014

Related U.S. Application Data

(60) Provisional application No. 61/790,123, filed on Mar. 15, 2013.

(51) Int. Cl.
*G06F 7/52* (2006.01)
*G06F 7/523* (2006.01)
*G06F 7/535* (2006.01)
*G06F 7/499* (2006.01)
*G06F 17/50* (2006.01)

(52) U.S. Cl.
CPC ............. *G06F 7/535* (2013.01); *G06F 7/52* (2013.01); *G06F 7/523* (2013.01); *G06F 7/49947* (2013.01); *G06F 17/505* (2013.01); *G06F 2207/5356* (2013.01)

(58) Field of Classification Search
CPC ............. G06F 7/52; G06F 7/523; G06F 7/535
See application file for complete search history.

(56) References Cited

U.S. PATENT DOCUMENTS

| 2004/0158595 | A1* | 8/2004 | Cheung | G06T 9/005 708/490 |
| 2005/0289209 | A1* | 12/2005 | Robison | G06F 7/535 708/650 |
| 2013/0103733 | A1* | 4/2013 | Drane | G06F 7/38 708/650 |

OTHER PUBLICATIONS

Robiison, N-Bit Unsigned Division Via N-Bit Multiply-Add, IEEE, 2005, 9 pages.*
Drane et. al. Correctly Rounded Constant Integer Division via Multiply-Add, IEEE, 1012, pp. 1243-1246.*

* cited by examiner

*Primary Examiner* — Chuong D Ngo
(74) *Attorney, Agent, or Firm* — Vorys, Sater, Seymour and Pease LLP

(57) ABSTRACT

A binary logic circuit is provided for determining a rounded value of $$\frac{px}{q},$$

where p and q are coprime constant integers with p<q and q≠$2^i$, i is any integer, and x is an integer variable between 0 and integer M where M≥2q, the binary logic circuit implementing in hardware the optimal solution of the multiply-add operation $$\frac{ax+b}{2^k}$$

where a, b and k are fixed integers.

20 Claims, 4 Drawing Sheets

CONSTANT FRACTION INTEGER MULTIPLICATION

BACKGROUND

This invention relates to a logic circuit for implementing binary multiplication by a constant fraction and to a method of deriving a binary logic circuit for performing such multiplication.

When designing integrated circuits, logic is often required to perform addition, subtraction, multiplication and division. Whilst addition, subtraction and multiplication operations can all be cheaply implemented in hardware, division is acknowledged to be an expensive operation to implement in hardware.

In the case that the divisor is known to be a constant at design-time, a division operation can be expressed as multiplication by a constant fraction and it is possible to construct efficient implementations of the division operation using a combination of addition and constant multiplication logic. This can significantly simplify the logic and hence reduce the area of integrated circuit needed to implement the division operation. For example, if the division operation $$\frac{px}{q},$$

where p and q are integer constants and x is an integer variable, can be rewritten in the form $$\frac{ax+b}{2^k},$$

then the division operation can be expressed in logic as a multiply-add operation whose result is right-shifted by k binary places. However, there are an infinite number of values of a, b and k which satisfy this equation, some of which provide less efficient expressions in logic than others.

US Patent Application 2013/0103733, which is incorporated by reference in its entirety, discloses techniques for deriving values for a, b and k for use in designing integrated circuit logic, but does not describe logic optimally configured according to the most efficient expression of multiplication by a constant fraction. Suboptimal expressions of division logic, even those embodied as a multiply-add operation, are overly complex and consume a greater area of integrated circuit than necessary.

BRIEF SUMMARY

According to a first aspect of the disclosure there is provided a binary logic circuit configured to determine a rounded value of $$\frac{px}{q},$$

where p and q are coprime constant integers with p<q and q≠$2^i$, i is any integer, and x is an integer variable between 0 and integer M where M≥2q, the binary logic circuit being configured to implement the operation:

$$\frac{ax+b}{2^k}$$

where a and b are fixed integers and k is the smallest integer that satisfies either:

$$\frac{2^k}{(p2^k) \bmod q} > q \left\lfloor \frac{M}{q} \right\rfloor - q + p^{-1}; \text{ or} \quad (a)$$

$$\frac{2^k}{(-p2^k) \bmod q} > M - ((M + p^{-1}) \bmod q) \quad (b)$$

wherein:
if (a) is satisfied by a smaller integer k than (b), then a is an integer given by $$\left\lfloor \frac{p2^k}{q} \right\rfloor$$

and b is an integer in the range $$\left[ \left\lfloor \frac{M}{q} \right\rfloor ((p2^k) \bmod q), \frac{2^k + (q - p^{-1})((p2^k) \bmod q)}{q} - 1 \right];$$

and
if (b) is satisfied by a smaller integer k than (a), then a is an integer given by $\left\lceil \frac{p2^k}{q} \right\rceil$ and b is an integer in the range $$\left[ 0, \frac{2^k - (M - ((M + p^{-1}) \bmod q))((-p2^k) \bmod q)}{q} - 1 \right].$$

The binary logic circuit may be a binary multiplier array having a plurality of rows, a first subset of the plurality of rows being configured to perform multiplication by the fixed integer a, a second subset of the plurality of rows being configured to perform the addition of b, and said rounded value being the output of the multiplier array right-shifted by k binary digits.

The first subset of the plurality of rows of the binary multiplier array may be a substantially minimum number of rows required to implement the multiplication of x by fixed integer a.

The second subset of the plurality of rows of the binary multiplier array may be a single row arranged to perform the addition of fixed integer b.

The plurality of rows of the multiplier array may be arranged such that the representations of the integer variable x at those rows are collectively truncated by a set of Δ least significant digits, the set of Δ least significant digits being substantially the largest number of least significant digits that can be discarded without causing the multiplier array to deviate from the true rounded value of $$\frac{px}{q}$$

for any x between 0 and M.

The fixed integer b may be the integer having the smallest Hamming weight which satisfies said operation for all x.

In the case that (a) is satisfied by a smaller integer k than (b), if there is more than one value of b having the same smallest Hamming weight, the fixed integer b may be the smallest value of b.

The multiplier may make use of a canonical signed digit representation.

The multiplier array may be unable to perform multiplication by a variable.

The binary logic circuit may be configured to determine the rounded value of $$\frac{px}{q}$$

according to any one of the following rounding schemes: round towards zero (RTZ), round towards negative infinity (RTN), round towards positive infinity (RTP), and round towards nearest with ties to upper (RTU).

In embodiments, a machine readable storage medium having encoded thereon non-transitory machine readable code can be provided for generating the binary logic circuit.

According to a second aspect, there is provided a fixed point filter comprising one or more binary logic circuits configured according to the teaching herein.

According to a third aspect, there is provided a method of deriving a hardware representation of a binary logic circuit configured to determine a rounded value of $$\frac{px}{q},$$

where p and q are coprime constant integers with p<q and $q \neq 2^i$, i is any integer, and x is an integer variable between 0 and integer M where M≥2q, the method comprising:
  determining an integer k being the smallest integer that satisfies either:

$$\frac{2^k}{(p2^k) \bmod q} > q \left\lfloor \frac{M}{q} \right\rfloor - q + p^{-1}; \text{ or} \quad (a)$$

$$\frac{2^k}{(-p2^k) \bmod q} > M - ((M + p^{-1}) \bmod q) \quad (b)$$

determining fixed integers a and b where:
    if (a) is satisfied by a smaller integer k than (b), calculating a as the integer given by $$\left\lfloor \frac{p2^k}{q} \right\rfloor$$

and selecting b from the set of one or more integers in the range $$\left[ \left\lfloor \frac{M}{q} \right\rfloor ((p2^k) \bmod q), \frac{2^k + (q - p^{-1})((p2^k) \bmod q)}{q} - 1 \right],$$

and
    if (b) is satisfied by a smaller integer k than (a), calculating a as the integer given by $$\left\lceil \frac{p2^k}{q} \right\rceil$$

and selecting b from the set of one or more integers in the range $$\left[ 0, \frac{2^k - (M - ((M + p^{-1}) \bmod q))((-p2^k) \bmod q)}{q} - 1 \right];$$

and
  deriving a hardware representation for a binary logic circuit configured to implement the operation:

$$\frac{ax + b}{2^k}$$

using the determined fixed integers a, b and k.

Deriving the hardware representation for the binary logic circuit may comprise implementing said operation using a binary multiplier array having a plurality of rows, a first subset of the plurality of rows being configured to perform multiplication by the fixed integer a, a second subset of the plurality of rows being configured to perform the addition of b, and the rounded value being the output of the multiplier array right-shifted by k binary digits.

The method may further comprise modifying said hardware representation by truncating a set of Δ least significant digits from the plurality of rows, the set of Δ least significant digits being substantially the largest set of least significant digits that can be discarded without causing the operation implemented by the binary logic circuit to deviate from the true rounded value of $$\frac{px}{q}$$

for any x between 0 and M.

The fixed integer b may be selected to be the integer having the smallest Hamming weight that satisfies the truncated hardware representation for the binary logic circuit.

Deriving the hardware representation may comprise selecting a multiplier array incapable of performing multiplication of integer x by a variable factor.

The hardware representation may be RTL, a hardware description language, or a gate-level description language.

In embodiments, a computer readable storage medium having encoded thereon non-transitory computer readable code can be provided for generating a hardware representation according to the method of the third aspect of the present invention.

According to a fourth aspect, there is provided a binary logic circuit configured to determine a rounded value of $$\frac{p*x+r}{q},$$

where p and q are coprime constant integers with p<q and $q \neq 2^i$, r is a positive integer, i is any integer, and x is an integer variable between integers A and B where (B−A)≥2q, the binary logic circuit being configured to implement the operation:

$$\frac{ax+b}{2^k}$$

where a and b are fixed integers and k is the smallest integer that satisfies either:

$$\frac{2^k}{(p2^k) \bmod q} > \beta^-_{min} - \beta^-_{max} \quad (a)$$

where, $$\beta^-_{max} = A + (-A - P^{-1}_q(r+1)) \bmod q$$

$$\beta^-_{min} = B - (B + r*P^{-1}_q) \bmod q$$

or:

$$\frac{2^k}{(-p2^k) \bmod q} > \beta^+_{max} - \beta^+_{min} \quad (b)$$

where, $$\beta^+_{max} = B - (B + P^{-1}_q(r+1)) \bmod q$$

$$\beta^+_{min} = A + (-A - r*P^{-1}_q) \bmod q$$

wherein:
if (a) is satisfied by a smaller integer k than (b), then a is an integer given by $$\left\lfloor \frac{p2^k}{q} \right\rfloor$$

and b is an integer in the range $$\left[ \frac{r2^k + \beta^-_{min}*(p2^k) \bmod q}{q}, \frac{2^k(r+1) + \beta^-_{max}*(p2^k) \bmod q}{q} - 1 \right];$$

and
if (b) is satisfied by a smaller integer k than (a), then a is an integer given by $$\left\lceil \frac{p2^k}{q} \right\rceil$$

and b is an integer in the range $$\left[ \frac{r2^k - \beta^+_{min}*(-p2^k) \bmod q}{q}, \frac{2^k(r+1) - \beta^+_{max}*(-p2^k) \bmod q}{q} - 1 \right].$$

According to a fifth aspect, there is provided a method of deriving a hardware representation of a binary logic circuit configured to determine a rounded value of $$\frac{p*x+r}{q},$$

wherein p and q are coprime constant integers with p<q and $q \neq 2^i$, r is a positive integer, i is any integer, and x is an integer variable between integers A and B where (B−A)≥2q, the method comprising:
determining an integer k being the smallest integer that satisfies either:

$$\frac{2^k}{(p2^k) \bmod q} > \beta^-_{min} - \beta^-_{max} \quad (a)$$

where, $$\beta^-_{max} = A + (-A - P^{-1}_q(r+1)) \bmod q$$

$$\beta^-_{min} = B - (B + r*P^{-1}_q) \bmod q$$

or:

$$\frac{2^k}{(-p2^k) \bmod q} > \beta^+_{max} - \beta^+_{min} \quad (b)$$

where, $$\beta^+_{max} = B - (B + P^{-1}_q(r+1)) \bmod q$$

$$\beta^+_{min} = A + (-A - r*P^{-1}_q) \bmod q$$

determining fixed integers a and b where:
if (a) is satisfied by a smaller integer k than (b), calculating a as the integer given by $$\left\lfloor \frac{p2^k}{q} \right\rfloor$$

and selecting b from the set of one or more integers in the range $$\left[ \frac{r2^k + \beta^-_{min}*(p2^k) \bmod q}{q}, \frac{2^k(r+1) + \beta^-_{max}*(p2^k) \bmod q}{q} - 1 \right],$$

and
if (b) is satisfied by a smaller integer k than (a), calculating a as the integer given by $$\left\lceil \frac{p2^k}{q} \right\rceil$$

and selecting b from the set of one or more integers in the range $$\left[\frac{r2^k - \beta_{min}^+ * (-p2^k) \bmod q}{q}, \frac{2^k(r+1) - \beta_{max}^+ * (-p2^k) \bmod q}{q} - 1\right];$$

and deriving a hardware representation for a binary logic circuit configured to implement the operation:

$$\frac{ax+b}{2^k}$$

using the determined fixed integers a, b and k.

BRIEF DESCRIPTION OF THE DRAWINGS

Aspects of the disclosure will now be explained by way of example with reference to the accompanying drawings. In the drawings.

DETAILED DESCRIPTION

The following description is presented by way of example to enable any person skilled in the art to make and use implementations of the disclosure. Implementations are not limited to the embodiments described herein and various modifications to the disclosed embodiments will be readily apparent to those skilled in the art.

There is a need for improved integrated circuit logic implementing multiplication by a constant fraction as a multiply-add operation in its most efficient form.

Consider the operation $$\frac{px}{q},$$

where p and q are integer constants and x is an integer variable. Such a multiplication by a constant fraction is common in hardware implementations of fixed point filters, for example:

$$y = \frac{1}{7}a + \frac{2}{7}bt + \frac{3}{7}ct^2 + \frac{1}{7}dt^3$$

In this example, the fixed point filter requires division by a constant divisor of 7. Conventionally such an operation would be implemented using complex logic designed for non-constant division, but a significant reduction in hardware complexity can be achieved by expressing the operation in the form $$\frac{ax+b}{2^k},$$

Which represents a multiply-add operation whose result is right-shifted by k binary places.

Figure 5:
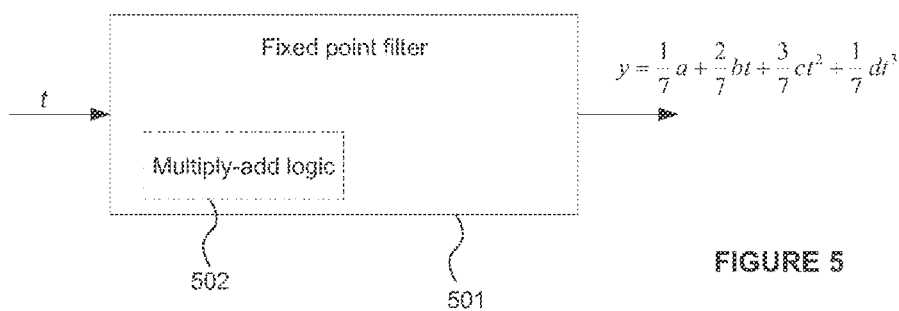
FIG. 5 is a schematic diagram of a fixed point filter.

A fixed point filter 501 configured in accordance with the present example is shown in FIG. 5. The filter receives an input value t and provides an output value y at a predetermined level of precision. The filter 501 comprises multiply-add logic 502 for performing multiplication by the constant fractions $\frac{1}{7}$, $\frac{2}{7}$ and $\frac{3}{7}$ as required by the filter. These operations could be performed by one or more sets of multiply-add logic 502 each configured to perform multiplication by a fraction having a constant divisor of 7.

For fixed point operations, the multiplication by a constant fraction operation to be performed is:

$$\text{Round}\left(\frac{px}{q}\right)$$

where round is performed according to the selected rounding scheme for the system concerned. Rounding schemes include, for example, round towards zero (RTZ), round towards negative infinity (RTN), round towards positive infinity (RTP), and round towards nearest with ties to upper (RTU). In the above operation, p and q are natural numbers and x is a positive integer between 0 and M. The following mathematical analysis also assumes that p and q are coprime constants and that:

$$p < q \quad q \neq 2^i \quad M \geq 2q$$

With a round towards negative infinity (RTN) or round towards zero (RTZ) scheme, the multiplication by a constant fraction operation can be expressed as the floor of a multiply-add operation:

$$\left\lfloor \frac{px}{q} \right\rfloor = \left\lfloor \frac{ax+b}{2^k} \right\rfloor = (ax+b) >> k$$

The rightmost notation indicates that the multiplication by a constant fraction operation reduces to a multiplication of the variable x by a constant 'a' followed by an addition of a constant 'b', with the result right-shifted by k places. This can be implemented very efficiently in hardware, for example through the use of a multiplication array and an adder unit. Shifting by a constant value k does not require any kind of hardware logic: this step can be achieved simply by hardwiring the binary output digits of the adder unit in the appropriate manner.

Figure 6:
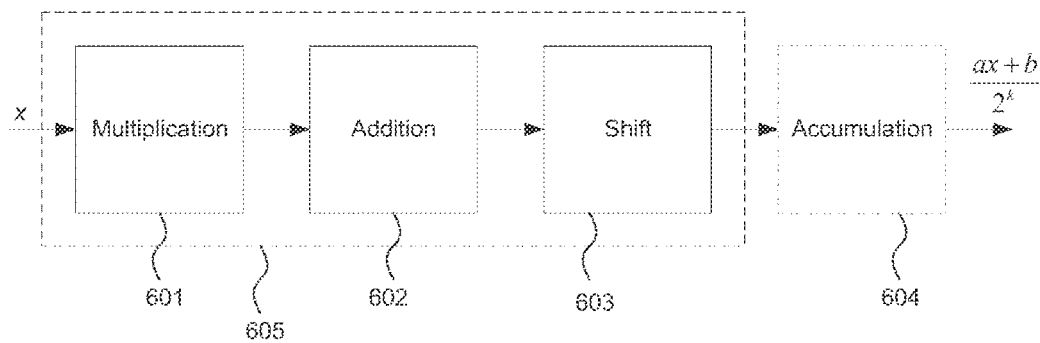
FIG. 6 is a schematic diagram of a logic circuit configured in accordance with the principles described herein.

A binary logic circuit 605 for performing multiplication by a constant fraction in the manner of multiply-add logic 502 is shown in FIG. 6. The logic circuit comprises logic for performing multiplication a*x 601, logic for performing addition of constant b 602 and a shift 603. So as to maximise speed and reduce the complexity of the binary logic circuit, it is advantageous if the addition logic 602 is merged with the multiplication logic 601. For example, in preferred embodiments the binary logic circuit is a multiplier array comprising a two or more rows configured to effect multiplication by the constant integer a, with the addition of constant b being performed at the multiplier array by introducing the value b as an additional row in the array. It is envisaged that at design time a reduction scheme is employed to reduce the height of the multiplication array as far as possible. This can help to reduce the height of an array to a substantially minimum number of rows. Shift 603 can be performed through appropriate hardwiring of the binary digits calculated at the logic circuit to the output of the logic circuit 605. No logic is required to implement a shift. An accumulator 604 can optionally be provided at the output of the logic circuit. The accumulator could form part of logic circuit 605 or be provided separately. No logic need be required to implement an accumulator.

The multiplier array 601 receives a value x which it multiplies by a constant a by means of logic optimised for performing that specific multiplication operation. The architecture of multiplier array 601 is such so as to perform multiplication by the fixed constant a (e.g. is preferably adapted for performing multiplication only by fixed constant a). It is advantageous if the array is not a generic multiplier configured for performing multiplication by a variable (e.g. a value specified at runtime). As has been discussed, this minimises the complexity and integrated circuit area consumed by the multiplier logic. Adder 602 performs an addition of a constant value b to the result from the multiplier array. Shift 603 then right-shifts the output of the adder by k places and the final output $$\frac{ax+b}{2^k}$$

is formed at the accumulator 604. Typically the shift would be achieved through suitable hardwiring of the output of the adder to the register elements of accumulator 604.

Figure 1:
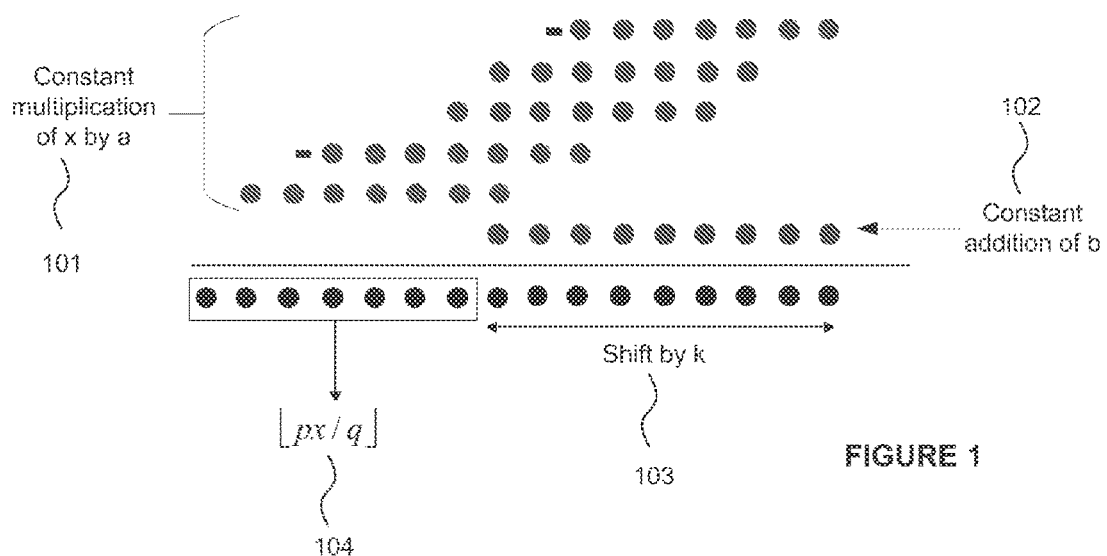
FIG. 1 is a schematic illustration of the multiply, add and shift operations performed by a multiplication array and adder unit in accordance with the examples described herein.

FIG. 1 schematically illustrates the multiply, add and shift operations performed by an array and adder unit in order to calculate $$\frac{ax+b}{2^k}.$$

Each dot represents a binary digit with the constant multiplication of the variable 'x' by 'a' being performed by means of an array of addition operations 101 as is known in the art. The result of the addition of binary constant 'b' at 102 is then shifted by k places as indicated by 103 in order to generate the binary output 104 representing the floor of $$\frac{px}{q}.$$

The negative signs before rows in the multiplication array indicate that, in the example, a canonical signed digit representation has been employed to decrease the Hamming weight of the binary values represented by those rows. This can often allow the multiplication array to be expressed more efficiently in hardware and consume a smaller integrated circuit area.

Typically there are many values of a, b and k which satisfy the above equation but that are difficult to identify using conventional simulation techniques. In order to minimise the complexity of the resulting hardware implementation, the inventor has identified that it is advantageous to select a minimum value of k. This has the effect of minimising the value of a and hence reducing the size of the multiplication array performing the operation a*x. Once the minimum values of k and a have been identified, a corresponding range of possible values of b can be identified. This freedom in b is used to remove least significant bits from the multiplier array. Typically the optimum value of b will correspond to a small value of b in the identified range having a small Hamming weight. As will now be shown, this solution represents the maximally efficient expression of $$\frac{px}{q}$$

in terms of binary multiply-add operations.

General expressions for the minimum value of k will now be derived for given integers p and q. A mathematical proof that this value of k represents the optimum solution will also be set out.

Existence and Feasibility of k

Firstly we check whether k always exists. It is always possible to find sufficiently large values for a and k such that, for any positive x:

$$0 \le \left(\frac{a}{2^k} - \frac{p}{q}\right) < \frac{1}{qx}$$

$$0 \le \left(\frac{a}{2^k} - \frac{p}{q}\right)x + \frac{q-1}{q} < 1$$

$$0 \le \left(\frac{a}{2^k} - \frac{p}{q}\right)x + \frac{(px) \bmod q}{q} < 1$$

$$0 \le \frac{ax}{2^k} - \left\lfloor \frac{px}{q} \right\rfloor < 1$$

Hence, $$\left\lfloor \frac{ax}{2^k} \right\rfloor = \left\lfloor \frac{px}{q} \right\rfloor$$

and feasible k always exists. In fact, if k is feasible then so is k+1 because:

$$\left\lfloor \frac{ax+b}{2^k} \right\rfloor = \left\lfloor \frac{(2a)x + (2b)}{2^{k+1}} \right\rfloor$$

The value k=0 can be readily shown to be infeasible because if k=0 then $$\left\lfloor \frac{px}{q} \right\rfloor = ax + b$$

Trying x=0 and x=q yields $$0 = b$$

$$p = aq$$

-continued $$\frac{p}{q} = a$$

But a is an integer and p<q so k=0 is infeasible. We can therefore conclude that the set of feasible k is of the form $$[k_{min}, \infty)$$

We can further conclude that the value of a corresponding to the minimum value solution for k is odd. If a was even then the following would be true and the minimum value of k would not be minimal.

$$\left\lfloor \frac{ax+b}{2^k} \right\rfloor = \left\lfloor \frac{(a/2)x + \lfloor b/2 \rfloor}{2^{k-1}} \right\rfloor$$

Hence when $k=k_{min}$ then a is odd.

Figure 2:
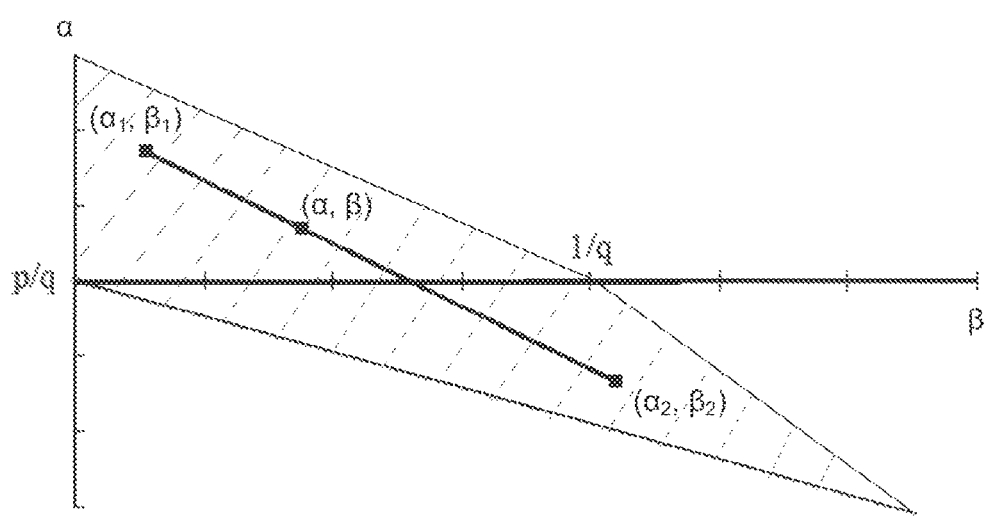
FIG. 2 is an illustration of a solution space.

FIG. 2 illustrates the solution space for the values of $\alpha$ and $\beta$ that satisfy $$\left\lfloor \frac{px}{q} \right\rfloor = \lfloor ax + \beta \rfloor$$

where $\alpha, \beta \in R$. By the following lemma, the solution space shown in FIG. 2 is convex.

Lemma Showing the Solution Space is Convex

Consider $$\lfloor \alpha_1 x + \beta_1 \rfloor = \lfloor \alpha_2 x + \beta_2 \rfloor \alpha_i, \beta_i \in R$$

Then the following must be true $$\lfloor \alpha x + \beta \rfloor = \lfloor \alpha_1 x + \beta_1 \rfloor = \lfloor \alpha_2 x + \beta_2 \rfloor$$

where $$\alpha = (1-\lambda)\alpha_1 + \lambda\alpha_2 \beta = (1-\lambda)\beta_1 + \lambda\beta_2 \lambda \in [0,1]$$

This result can be proved as follows:

$$\alpha_i x + \beta_i = c + d_i \quad c \in Z \quad d_i \in [0, 1)$$

$$\lfloor \alpha x + \beta \rfloor = \lfloor (1-\lambda)(\alpha_1 x + \beta_1) + \lambda(\alpha_2 x + \beta_2) \rfloor$$

$$= c + \lfloor (1-\lambda)d_1 + \lambda d_2 \rfloor$$

$$= c = \lfloor \alpha_i x + \beta_i \rfloor$$

Hence the solution space is convex.

Corollary Proving a and k are Feasible

A corollary of the above lemma is that we can prove that a and k are feasible:

If $$\left\lfloor \frac{px}{q} \right\rfloor = \lfloor \alpha_1 x + \beta_1 \rfloor = \lfloor \alpha_2 x + \beta_2 \rfloor \quad \alpha_i, \beta_i \in R \quad x \in Z$$

Then assuming there exists $$\alpha_1 < \frac{a}{2^k} < \alpha_2$$

then there must exist $$\lambda \in [0, 1] \quad \frac{a}{2^k} = (1-\lambda)\alpha_1 + \lambda\alpha_2$$

For this $\lambda$ let $$\beta (1-\lambda)\beta_1 + \lambda\beta_2$$

Then $$\left\lfloor \frac{px}{q} \right\rfloor = \left\lfloor \frac{a}{2^k} x + \beta \right\rfloor = \left\lfloor \frac{ax + \lfloor 2^k \beta \rfloor}{2^k} \right\rfloor = \left\lfloor \frac{ax + b}{2^k} \right\rfloor$$

$$b = \lfloor 2^k \beta \rfloor$$

Hence we can conclude that a and k are feasible if $$\alpha_i \in R$$

$$\alpha_1 < \frac{a}{2^k} < \alpha_2$$

In fact, when k is a minimum then a must be unique because if not then $$\left\lfloor \frac{a_1 x + b_1}{2^k} \right\rfloor = \left\lfloor \frac{a_2 x + b_2}{2^k} \right\rfloor$$

$$a_1 \neq a_2$$

and by the above lemma, every real number in the following interval is feasible $$\left[ \frac{a_1}{2^k}, \frac{a_2}{2^k} \right]$$

Given $a_1$ and $a_2$ are odd then there would exist an even value of a between them that is also feasible, which is a contradiction on k being minimal. Hence a must be unique.

Values of a Corresponding to Minimum k

We can now identify the value of a which corresponds to the minimum value of k.

If the following were true $$a_{min} > \left\lceil \frac{p 2^k}{q} \right\rceil$$

then $$\frac{p}{q} < \frac{1}{2^k} \left\lceil \frac{p 2^k}{q} \right\rceil < \frac{a_{min}}{2^k}$$

By the above corollary $$a = \left\lceil \frac{p 2^k}{q} \right\rceil$$

would also be feasible. But this would be a contradiction on $a_{min}$ being unique. Hence $$a_{min} \le \left\lceil \frac{p2^k}{q} \right\rceil \quad (A1)$$

Similarly, if the following were true $$a_{min} < \left\lfloor \frac{p2^k}{q} \right\rfloor$$

then $$\frac{a_{min}}{2^k} < \frac{1}{2^k}\left\lfloor \frac{p2^k}{q} \right\rfloor < \frac{p}{q}$$

And by the above corollary $$a = \left\lfloor \frac{p2^k}{q} \right\rfloor$$

would also be feasible. But this would be a contradiction on $a_{min}$ being unique. Hence $$a_{min} \ge \left\lfloor \frac{p2^k}{q} \right\rfloor \quad (A2)$$

In conclusion, when k is at a minimum, the corresponding value of a is one of:

$$\left\lfloor \frac{p2^k}{q} \right\rfloor \text{ and } \left\lceil \frac{p2^k}{q} \right\rceil$$

In other words, the value of a when k is at a minimum is the floor of $$\frac{p2^k}{q}$$

or the ceiling of $$\frac{p2^k}{q}.$$

Value of b for the Case $a=\text{floor}(p2^k/q)$

We can now identify the value of b when k is at a minimum and a is the floor of $$\frac{p2^k}{q}.$$

Using the following identity $$\left\lfloor \frac{A}{B} \right\rfloor = \frac{A - (A \bmod B)}{B}$$

we can identify the necessary conditions on k and b to satisfy $$a = \left\lfloor \frac{p2^k}{q} \right\rfloor.$$

$$\left\lfloor \frac{px}{q} \right\rfloor = \left\lfloor \frac{ax+b}{2^k} \right\rfloor \quad (F)$$

$$0 \le \frac{ax+b}{2^k} - \left\lfloor \frac{px}{q} \right\rfloor < 1$$

$$0 \le (aq - p2^k)x + 2^k((px) \bmod q) + bq < q2^k$$

$$0 \le 2^k((px) \bmod q) - x((p2^k) \bmod q) + bq < q2^k$$

In order to find k and b that satisfy expression (F), we need to bound the function f(x) which we define as:

$$f(x) = 2^k((px) \bmod q) - x((p2^k) \bmod q)$$

Trying $x = x_{max} = q - p^{-1}$ where $p^{-1} p = 1 \bmod q$ (which always exists because p and q are coprime) and rearranging the upper bound of expression (F) we get:

$$b < \frac{2^k + (q - p^{-1})((p2^k) \bmod q)}{q}$$

which is an integer.
Now trying the substitution $$x = x_{min} = q\left\lfloor \frac{M}{q} \right\rfloor$$

and rearranging the lower bound of expression (F) we get:

$$\left\lfloor \frac{M}{q} \right\rfloor ((p2^k) \bmod q) \le b$$

We can therefore conclude that the necessary condition on b is:

$$b \in \left[ \left\lfloor \frac{M}{q} \right\rfloor ((p2^k) \bmod q), \frac{2^k + (q - p^{-1})((p2^k) \bmod q)}{q} - 1 \right] \quad (B1)$$

This interval must be non-empty for b to exist. In other words, the following must be true:

$$\left\lfloor \frac{M}{q} \right\rfloor ((p2^k) \bmod q) < \frac{2^k + (q - p^{-1})((p2^k) \bmod q)}{q}$$

and hence $$\frac{2^k}{(p2^k) \bmod q} > q \left\lfloor \frac{M}{q} \right\rfloor - q + p^{-1}$$

These necessary conditions on k are actually sufficient because it follows from the preceding equation and the initial condition $$M \geq 2q \Rightarrow \left\lfloor \frac{M}{q} \right\rfloor \geq 2$$

that $$\frac{2^k}{(p2^k) \bmod q} > q$$

We can now identify the bounds on our function f(x). Rewriting f(x) as $$\frac{f(x)}{2^k} = \underbrace{((px) \bmod q)}_{\in [0, q-1]} - x \underbrace{\frac{(p2^k) \bmod q}{2^k}}_{< x/q}$$

we can conclude that the maximum f(x) is attained for the smallest x such that $$(px) \bmod q = q-1$$

and hence $$x_{max} = q - p^{-1} \quad (X\_MAX\_L)$$

And the minimum f(x) is attained for the largest x such that $$(px) \bmod q = 0$$

and hence $$x_{min} = q \left\lfloor \frac{M}{q} \right\rfloor (X\_MIN\_L)$$

It will be appreciated that the equations (X_MAX_L) and (X_MIN_L) represent tight bounds on x for the case $$a = \left\lfloor \frac{p2^k}{q} \right\rfloor.$$

Value of b for the Case a=ceiling($p2^k/q$)

We can now identify the value of b when k is at a minimum and a is the ceiling of $$\frac{p2^k}{q}.$$

Using the following identity $$\left\lceil \frac{A}{B} \right\rceil = \frac{A + ((-A) \bmod B)}{B}$$

we can identify the necessary conditions on k and b to satisfy $$a = \left\lceil \frac{p2^k}{q} \right\rceil.$$

$$\left\lfloor \frac{px}{q} \right\rfloor = \left\lfloor \frac{ax+b}{2^k} \right\rfloor \quad (G)$$

$$0 \leq \frac{ax+b}{2^k} - \left\lfloor \frac{px}{q} \right\rfloor < 1$$

$$0 \leq (aq - p2^k)x + 2^k((px) \bmod q) + bq < q2^k$$

$$0 \leq 2^k((px) \bmod q) + x((-p2^k) \bmod q) + bq < q2^k$$

In order to find k and b that satisfy expression (G), we need to bound the function g(x) which we define as:

$$g(x) = 2^k((px) \bmod q) + x((-p2^k) \bmod q)$$

Trying $$x = x_{max} = M - ((M + p^{-1}) \bmod q)$$

and rearranging the upper bound of expression (G) we get:

$$b < \frac{2^k - (M - ((M + p^{-1}) \bmod q))((-p2^k) \bmod q)}{q}$$

which is an integer.

Now trying the substitution $x = x_{min} = 0$ and rearranging the lower bound of expression (G) we get:

$$0 \leq b$$

We can therefore conclude that the necessary condition on b is:

$$b \in \left[ 0, \frac{2^k - (M - ((M + p^{-1}) \bmod q))((-p2^k) \bmod q)}{q} - 1 \right] \quad (B2)$$

This interval must be non-empty for b to exist. In other words, the following must be true:

$$0 < 2^k - (M - ((M + p^{-1}) \bmod q))((-p2^k) \bmod q)$$

and hence $$\frac{2^k}{(-p2^k) \bmod q} > M - ((M + p^{-1}) \bmod q)$$

These necessary conditions on k are actually sufficient because it follows from the preceding equation and the initial condition $$M \geq 2q \Rightarrow \left\lfloor \frac{M}{q} \right\rfloor \geq 2$$

that $$\frac{2^k}{(-p2^k) \bmod q} > q$$

We can now identify the bounds on our function g(x). Rewriting g(x) as $$\frac{g(x)}{2^k} = \underbrace{((px) \bmod q)}_{\in [0, q-1]} + x \underbrace{\frac{(-p2^k) \bmod q}{2^k}}_{<x/q}$$

we can conclude that the maximum g(x) is attained for the largest x such that $(px) \bmod q = q-1$ and hence $x = x_{max} = M - ((M+p^{-1}) \bmod q)$  (X_MAX_U)

And the minimum g(x) is attained for $x_{min} = 0$  (X_MIN_U)

It will be appreciated that the equations (X_MAX_U) and (X_MIN_U) represent tight bounds on x for the case $$a = \left\lceil \frac{p2^k}{q} \right\rceil.$$

Optimal Parameter Selection

Using the values of a and b derived above (see equations A1, A2 and B1, B2) which represent necessary and sufficient conditions on k, we obtain the following two sets of conditions on k, a and b which represent optimal solutions for expressing multiplication by a constant fraction in the form $$\frac{ax+b}{2^k}.$$

$$k_{min}^- = \min\left(k: \frac{2^k}{(p2^k) \bmod q} > q\left\lfloor \frac{M}{q} \right\rfloor - q + p^{-1}\right) \quad \text{Set 1}$$

i.e. $k_{min}^-$ is the smallest value of k that satisfies $$\frac{2^k}{(p2^k) \bmod q} > q\left\lfloor \frac{M}{q} \right\rfloor - q + p^{-1}$$

$$a_{min}^- = \left\lfloor \frac{p2^{k_{min}^-}}{q} \right\rfloor$$

$$b^- \in \left[\left\lfloor \frac{M}{q} \right\rfloor ((p2^{k_{min}^-}) \bmod q), \frac{2^{k_{min}^-} + (q - p^{-1})((p2^{k_{min}^-}) \bmod q)}{q} - 1\right]$$

$$k_{min}^+ = \min\left(k: \frac{2^k}{(-p2^k) \bmod q} > M - ((M+p^{-1}) \bmod q)\right) \quad \text{Set 2}$$

i.e. $k_{min}^+$ is the smallest value of k that satisfies $$\frac{2^k}{(-p2^k) \bmod q} > M - ((M+p^{-1}) \bmod q)$$

$$a_{min}^+ = \left\lceil \frac{p2^{k_{min}^+}}{q} \right\rceil$$

$$b_{min}^+ \in \left[0, \frac{2^{k_{min}^+} - (M - ((M+p^{-1}) \bmod q))((-p2^{k_{min}^+}) \bmod q)}{q} - 1\right]$$

The optimum solution is that set of k, a and b which correspond to the smallest of $k_{min}^-$ and $k_{min}^+$.

The optimum solution provides the most efficient logic implementation of a multiplier array for performing the operation round $$\left(\frac{px}{q}\right)$$

for all values of p and q that satisfy the initial set of constraints. This is particularly useful for values of p and q for which the optimum logic implementation has a complex relationship to the ratio p/q. Examples of such values of p and q include the set of ratios p/q where p>1, and the set of ratios p/q where p=1 and q!=(2^j)*((2^i)±1) for all integer i, j.

Example

By way of an example, consider determining the optimum multiply-add solution for the following multiplication by a constant fraction operation in which p=7, q=9 and M=255 (i.e. performed to a fixed point precision of 8 bits).

$$\frac{7x}{9} = \frac{ax+b}{2^k}$$

In order to identify the optimal set of a, b and k we determine $k_{min}^-$ and $k_{min}^+$:

$$k_{min}^- = \min\left(k: \frac{2^k}{(7*2^k) \bmod 9} > 247\right)$$

$$k_{min}^+ = \min\left(k: \frac{2^k}{(-7*2^k) \bmod 9} > 248\right)$$

Trying k=7 and 8, for $k_{min}^-$ we get:

$$\frac{2^7}{(7*2^7) \bmod 9} = 25.6 \quad \frac{2^8}{(7*2^8) \bmod 9} = 256$$

and for $k_{min}^+$ we get:

$$\frac{2^7}{(-7*2^7) \bmod 9} = 32 \quad \frac{2^8}{(-7*2^8) \bmod 9} = 32$$

Hence $k_{min}$=8 and we use the first set of $k_{min}^-$, $a_{min}^-$ and $b_{min}^-$.

The value of a is therefore $$a_{min}^- = \left\lfloor \frac{7*2^8}{9} \right\rfloor = 199$$

and the value of b is $$b^- \in \left[ \begin{array}{c} \left\lfloor \frac{255}{9} \right\rfloor ((7*2^8) \bmod 9), \\ \frac{2^8 + (9-7^{-1})((7*2^8) \bmod 9)}{9} - 1 \end{array} \right] = [28, 28] = 28$$

Thus, the optimal multiply-add expression of the multiplication by a constant fraction operation is:

$$\left\lfloor \frac{7x}{9} \right\rfloor = \left\lfloor \frac{199x + 28}{2^8} \right\rfloor \quad \text{(OPT)}$$

Figure 3:
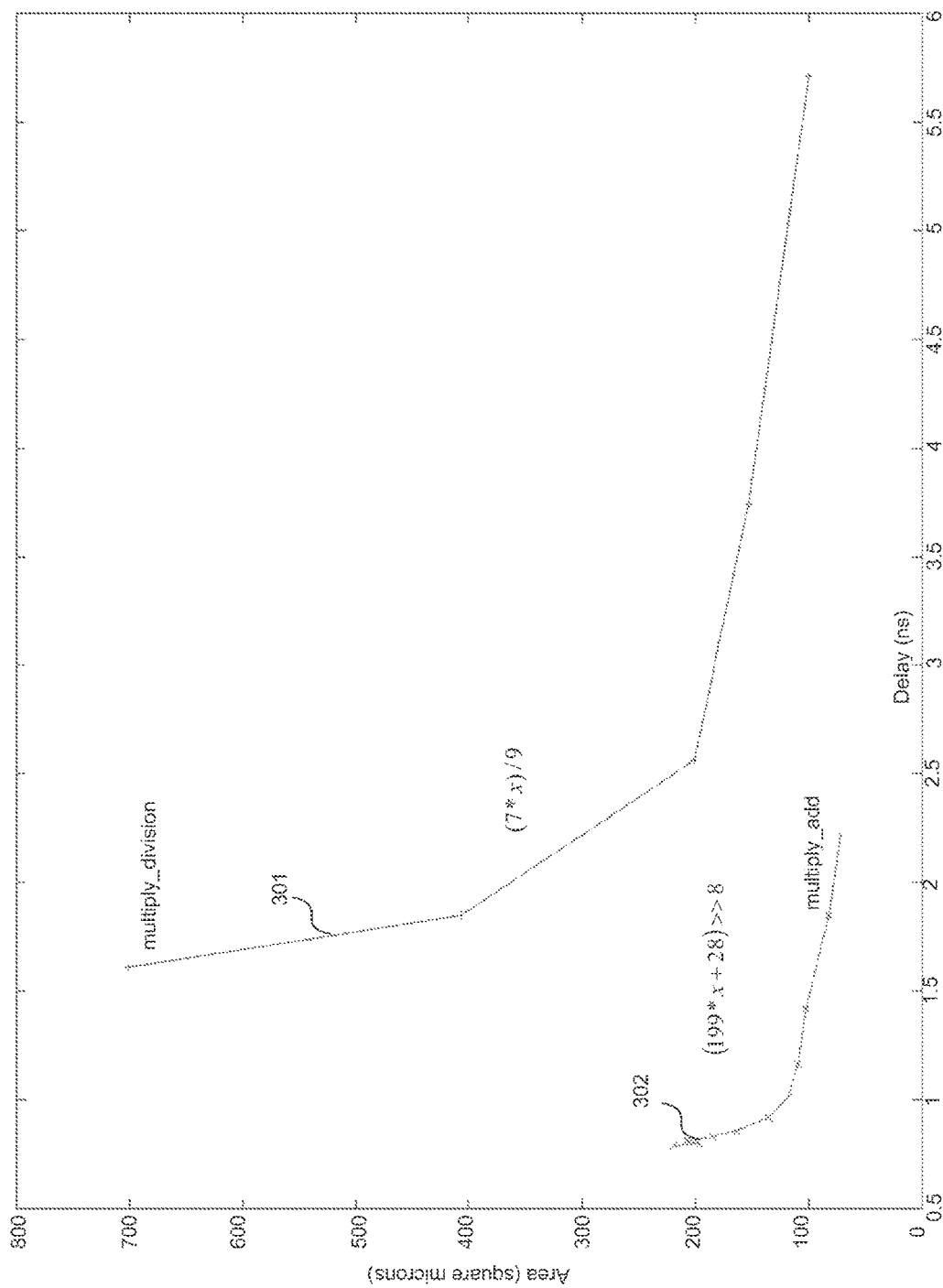
FIG. 3 illustrates the advantages of implementing multiplication by a constant fraction using a 40 nm process according to the principles taught herein.

FIG. 3 illustrates the advantages of implementing the multiplication by a constant fraction operation of the present example using the optimal solution. The bottom axis of the plot in FIG. 3 represents delay in ns and the left-hand axis represents area in square micrometers. Line 301 connects points in the plot representing the operational delay and area consumed by each of a set of logic designs generated by conventional logic synthesis software for performing the present multiplication by a constant fraction operation using non-constant division logic. Line 302 connects points in the plot representing the operational delay and area consumed by each of a set of logic designs that implement present multiplication by a constant fraction operation according to the optimal multiply-add operation expressed in equation (OPT) above. As can be seen from the plot, logic designs implemented according to the optimal design solution taught herein are around four times smaller in terms of the area of integrated circuit consumed, and twice as fast.

Freedom in b

In general, for the following relationship there is some freedom in the choice of b because the result is rounded and hence there exists a range of solutions to the right hand side of the equation which yield the same result.

$$\left\lfloor \frac{px}{q} \right\rfloor = \left\lfloor \frac{ax+b}{2^k} \right\rfloor$$

Thus, b $\in [b_{min}, b_{max}]$ is the range which satisfies the preceding equation.

Figure 4:
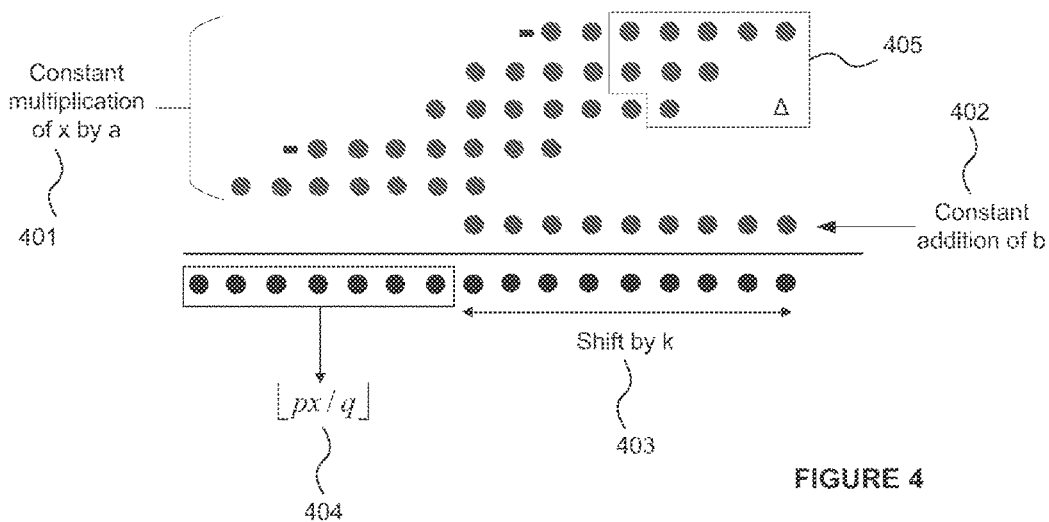
FIG. 4 illustrates a fixed point multiplication array from which a set of least significant binary digits A are removed.

The inventor has identified that a further optimisation of a multiply-add implementation of a multiplication by a constant fraction operation can be achieved by truncating a set of least significant binary digits Δ from the multiplication array used to perform the multiplication of x by a (see 101 in FIG. 1). This is illustrated in FIG. 4 which shows the multiplication operation 401, the addition operation 402, and shift 403. A set 405 of least significant binary digits Δ can be removed from the array without modifying the result 404 calculated by the array at the level of fixed point precision to which the multiplication by a constant fraction operation is performed. The area of integrated circuit consumed by the multiply-add implementation is consequently reduced.

The relationship between the bounds on the set Δ and the bounds of the possible range of values of b are given by the following sufficient condition:

$$\max(\Delta) - \min(\Delta) \leq b_{max} - b_{min}$$

$$b \in [b_{min} + \max(\Delta), b_{max} + \min(\Delta)] \quad (S_{delta})$$

The set of multiplier array bits in the set Δ can be chosen at design time on a trial-and-error basis with the aim of making the set Δ as large as possible and hence to remove as much as possible from the multiplier array. One way of achieving this is as follows.

1. As a first step, set Δ to be the least significant column of bits in the multiplier array generated in accordance with the optimal sets of parameters taught herein,
2. Test whether Δ satisfies the sufficient condition, $S_{delta}$.
3. If Δ satisfies the sufficient condition, add the next least significant column to the set Δ and re-perform step 2.
4. Iterate steps 2 and 3 until the sufficient condition no longer holds, i.e. a multiplier array implementing the operation $$\frac{ax+b}{2^k}$$

in hardware according to an optimal set of parameters a, b and k as taught herein would no longer be guaranteed to give the true rounded value of $$\frac{px}{q}$$

that the operation is implemented to provide.

5. Choose the resulting set of bits for use as an initial guess for Δ.

Often there will be some remaining freedom in b such that further bits can be removed from that column of bits of the array which caused the sufficient condition to no longer hold at step 4. In order to minimise the size of the multiplier array as far as possible, it is advantageous to at design time identify which further bits can be removed from that column of bits of the array whilst still satisfying the sufficient condition, $S_{delta}$. This can be done using trial and error. The choice of these bits of Δ is arbitrary so long as the sufficient condition still holds.

Where canonical signed digit form is used in hardware, certain rows in the multiplier array are represented as negative rows in order to improve the efficiency of the hardware implementation of the desired logic operations. Typically a multiplier array configured to use canonical signed digit form adds together all of the rows of the array but performs a suitable transformation on the negative rows so as to effect the correct logical operation.

For example, a negative row can have the formula $-x*2^i$. Since it is known that the array is going to sum to a positive K bit binary number (e.g. a large enough binary number such that it can store any output from the array), we can add $2^k$ to any negative row as this will not affect any of the K least significant bits, which include the output bits of the array. Thus, the above formula becomes $$2^k - x*2^i = (\text{not}(x) + 1)*2^i$$

where not(x) is the logical negation of x if x were interpreted as an K-i bit number (this may involve the appending of many 0 s to the front of x). When any appended 0 s are logically negated they become 1 s. These leading 1 s are what is called signed extending x. The logical negation comes from the positive equation $$\text{not}(t)+t=2^n-1$$

assuming t is an n-bit unsigned binary number.

The constant 1 s as well as the constant addition of $2^i$ can be absorbed into the constant b, leaving the negative row as:

$$\text{not}(x)*2^i$$

where the not is applied just to the length of x.

In this manner, arithmetic negation can correspond to logical bitwise negation of x (with some adaption to the value of b).

Once a best guess for $\Delta$ has been established, the maximum and minimum values of the set $\Delta$ can be calculated as follows where canonical signed digit form is used. Each row in the multiplication array is a copy of the variable x, left-shifted by i bits where i is the position of the respective ith bit of fixed integer a having a value of +1 or −1 (since canonical signed digit form is being used in hardware). For the identified set of least significant bits $\Delta$, we can identify all the times the bit x[0] appears, the bit x[1] appears, x[2] etc. Each bit x[j] might appear in a negative or positive row of the multiplier array.

In order to calculate a lower bound for the minimum of $\Delta$:
where the most significant (i.e. left-most) occurrence of x[j] appears in a negative row, we choose to set all those positions x[j]=1;
where the most significant (i.e. left-most) occurrence of x[j] appears in a positive row, we choose to set all those positions x[j]=0.

In order to calculate an upper bound for the maximum of $\Delta$:
where the most significant (i.e. left-most) occurrence of x[j] appears in a negative row, we choose to set all those positions x[j]=0;
where the most significant (i.e. left-most) occurrence of x[j] appears in a positive row, we choose to set all those positions x[j]=1.

By following this procedure at design time for all the bit positions in x which appear in delta, we obtain the minimum and maximum bounds for $\Delta$.

The new range of b can be calculated from the maximum and minimum values of $\Delta$ using the sufficient condition $S_{delta}$ set out above. A sensible value of b is the value in that range having the minimum Hamming weight.

Method of IC Design

The optimal solutions for a multiply-add implementation of a multiplication by a constant fraction operation which are described herein can be determined by suitable software. Typically, integrated circuits are initially designed using software (e.g. Synopsis Design Compiler) that generates a logical abstraction of the desired integrated circuit. Such an abstraction is generally termed register-transfer level or RTL. Once the logical operation of the integrated circuit has been defined, this can be used by synthesis software (e.g. Synopsis IC Compiler) to create representations of the physical integrated circuit. Such representations can be defined in high level hardware description languages, for example Verilog or VHDL and, ultimately, according to a gate-level description of the integrated circuit.

Logic for performing multiplication by a constant fraction can be readily introduced into an integrated circuit at design time. However, the design software used for designing integrated circuits will almost invariably provide the functionality using logic for performing generic division—i.e. logic for performing division by a divisor specified at runtime. Such logic is complex and consumes a significant area of integrated circuit. It is therefore preferable that, where logic for performing multiplication by a constant fraction is required, design software is configured to use logic optimised for performing multiplication by a constant fraction by means of a multiply-add operation of the form $$\frac{ax+b}{2^k}.$$

The optimal solution for such an operation is described herein.

It is advantageous if software for designing an integrated circuit is configured to, on a multiplication by a constant fraction operation being specified by the designer, implement the operation in accordance with the design principles described herein. This could be by introducing into the integrated circuit design RTL defining a multiply-add operation of the form $$\frac{ax+b}{2^k}$$

rather than a generic division function. The values of a, b and k can be chosen according to the optimal parameter selections described above. The software could implement multiplication by a constant fraction using a multiplier array. Preferably the software would be further configured to remove a set of $\Delta$ least significant bits from the multiplier array, as taught herein. The design of an integrated circuit can be effected according to the rules embodied in the design software at a data processing device executing the design software (such as a workstation or server).

Figure 7:
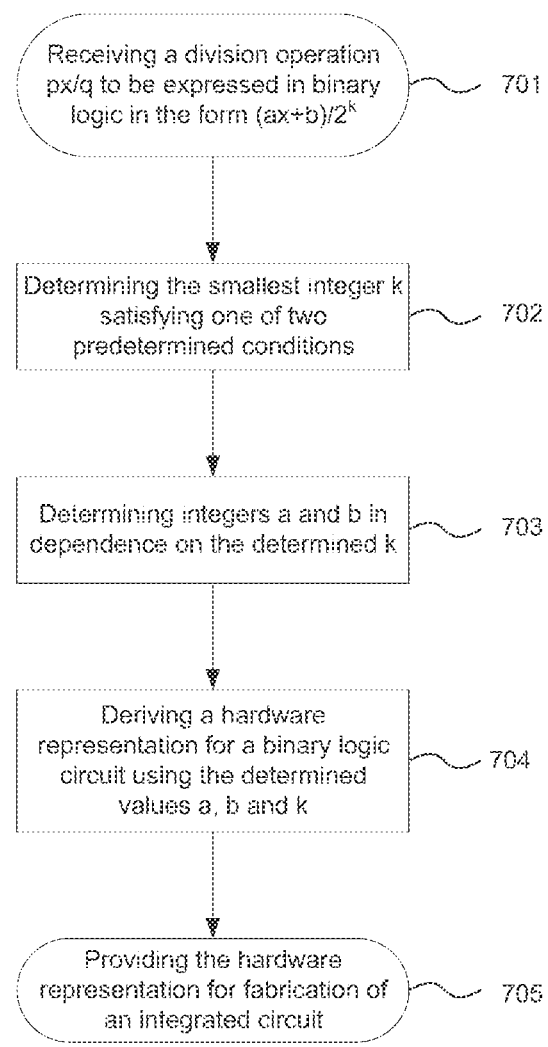
FIG. 7 is a flowchart illustrating a method according to the principles described herein.

A method of deriving a hardware representation of a binary logic circuit in accordance with the principles set out herein is illustrated in the flowchart of FIG. 7. At 701, a multiplication by a constant fraction operation $$\frac{px}{q}$$

to be expressed in the efficient form $$\frac{ax+b}{2^k}$$

is received. At 702, the appropriate smallest value of k is then determined from the minimum values of k that satisfy set 1 or 2 of the optimal parameter sets described above. The resulting value of k is then used at 703 to determine the appropriate values of a and b—i.e. the values of a and b from the corresponding set of the selected k are used. Once appropriate values of a, b and k have been identified, at 704 a hardware representation of a binary logic circuit in the form $$\frac{ax+b}{2^k}$$

is derived in the desired format. For example, the hardware representation could be a register-transfer level (RTL) representation, a high-level circuit representations such as Verilog or VHDL, or a lower-level representations such as OASIS or GDSII. The hardware representation of the binary logic circuit can be provided (typically as part of a larger-scale chip design) for fabrication into an integrated circuit. For example, a low-level representation of an IC could be provided directly to a foundry for fabrication of the specified integrated circuit, or RTL could be provided to an intermediate chip designer who would themselves design a low-level representation of an IC from the RTL for provision to a foundry.

The method of FIG. 7 could be implemented in program code, such as RTL design software. For example, on a user of the software specifying a multiplication by a constant fraction operation, the RTL design software could be configured to implement the operation using RTL defining multiply-add logic in the form $$\frac{ax+b}{2^k},$$

where a, b and k take the values described herein.

General Optimal Solution

The above-described optimal solutions for a multiply-add implementation of a multiplication by a constant fraction operation can be extended to the following more general operation.

$$\left\lfloor \frac{p*x+r}{q} \right\rfloor = (a*x+b) \gg k$$

where x is in the range [A, B] and r is a positive integer.

The two sets of k, a, b which represent the optimal solutions in this more general case are as follows. These solutions can be derived by following the same steps set out above for the more limited case in which the optimal solution to $$\frac{px}{q}$$

is sought and with the same constraints, but with x being in the range [A, B] and the constraint M≥2q being replaced by (B−A)≥2q.

Set 1

$$k^- = \min\left(k: \frac{2^k}{(p2^k)\bmod q} > \beta^-_{min} - \beta^-_{max}\right)$$

$$a^- = \left\lfloor \frac{p2^k}{q} \right\rfloor$$

$$b^- \in \left[ \frac{r2^k + \beta^-_{min}*(p2^k)\bmod q}{q}, \frac{2^k(r+1) + \beta^{-1}_{max}*(p2^k)\bmod q}{q} - 1 \right]$$

where $$\beta^-_{max} = A + (-A - P_q^{-1}(r+1))\bmod q$$
$$\beta^-_{min} = B - (B + r*P_q^{-1})\bmod q$$

Set 2

$$k^+ = \min\left(k: \frac{2^k}{(-p2^k)\bmod q} > \beta^+_{max} - \beta^+_{min}\right)$$

$$a^+ = \left\lceil \frac{p2^k}{q} \right\rceil$$

$$b^+ \in \left[ \frac{r2^k - \beta^+_{min}*(-p2^k)\bmod q}{q}, \frac{2^k(r+1) - \beta^+_{max}*(-p2^k)\bmod q}{q} - 1 \right]$$

where $$\beta^+_{max} = B - (B + P_q^{-1}(r+1))\bmod q$$
$$\beta^+_{min} = A + (-A - r*P_q^{-1})\bmod q$$

Again, the smallest of $k^-$ and $k^+$ and its associated a and b values represent the optimal solution. In the case that A is negative, x can be a signed number and the optimised multiplier array for performing the desired multiplication by a constant fraction is configured to accept and return signed numbers.

The fixed point filter of FIG. 5 and the frame processor of FIG. 6 are shown as comprising a number of functional blocks. This is schematic only and is not intended to define a strict division between different logic elements of an integrated circuit. Each functional block can be provided in any suitable manner.

The terms software and computer readable program code as used herein includes executable code for processors (e.g. CPUs and/or GPUs), firmware, bytecode, programming language code such as C or OpenCL, and modules for reconfigurable logic devices such as FPGAs. Machine-readable code includes software and code for defining hardware representations of integrated circuits at any level, including at register transfer level (RTL), at high-level circuit representations such as Verilog or VHDL, and lower-level representations such as OASIS and GDSII.

The algorithms and methods described herein could be performed by one or more physical processing units executing software that causes the unit(s) to perform the algorithms/methods. The or each physical processing unit could be any suitable processor, such as a CPU or GPU (or a core thereof), or fixed function or programmable hardware. The software could be stored in non-transitory form at a machine readable medium such as an integrated circuit memory, or optical or magnetic storage. A machine readable medium might comprise several memories, such as on-chip memories, computer working memories, and non-volatile storage devices.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. In an integrated circuit for performing mathematical operations, the improvement comprising a binary logic circuit configured to determine, for an input value x, a rounded value of $$\frac{px}{q}$$

by implementing the operation $$\frac{ax+b}{2^k},$$

where p and q are coprime constant integers with p<q and q≠$2^i$, i is an integer, input value x is an integer variable between 0 and integer M where M≥2q,
a and b are predetermined fixed integers, and k is the smallest integer that satisfies either:

$$\frac{2^k}{(p2^k) \bmod q} > q\left\lfloor\frac{M}{q}\right\rfloor - q + p^{-1}; \text{ or} \quad (a)$$

$$\frac{2^k}{(-p2^k) \bmod q} > M - ((M + p^{-1}) \bmod q); \quad (b)$$

wherein the binary logic circuit comprises:
multiplication and addition logic comprising a binary multiplier array having an input to receive x and configured to perform the multiplication of x by the predetermined fixed integer a and being incapable of performing multiplication of x by a variable factor, wherein the multiplication and addition logic is further configured to perform the addition of b;
wherein, in dependence on the values of p and q:
if (a) is satisfied by a smaller integer k than (b), then a is predetermined to be an integer given by $$\left\lfloor\frac{p2^k}{q}\right\rfloor$$

and b is predetermined to be an integer in the range $$\left[\left\lfloor\frac{M}{q}\right\rfloor((p2^k) \bmod q), \frac{2^k + (q - p^{-1})((p2^k) \bmod q)}{q} - 1\right];$$

and
if (b) is satisfied by a smaller integer k than (a), then a is predetermined to be an integer given by $$\left\lceil\frac{p2^k}{q}\right\rceil$$

and b is predetermined to be an integer in the range $$\left[0, \frac{2^k - (M - ((M + p^{-1}) \bmod q))((-p2^k) \bmod q)}{q} - 1\right].$$

2. A binary logic circuit as claimed in claim 1, wherein the binary multiplier array has a plurality of rows, a first subset of the plurality of rows being configured to perform the multiplication by the fixed integer a, a second subset of the plurality of rows being configured to perform the addition of b, and said rounded value being the output of the multiplier array right-shifted by k binary digits.

3. A binary logic circuit as claimed in claim 2, the first subset of the plurality of rows of the binary multiplier array being a substantially minimum number of rows required to implement the multiplication of x by fixed integer a.

4. A binary logic circuit as claimed in claim 2, the second subset of the plurality of rows of the binary multiplier array being a single row arranged to perform the addition of fixed integer b.

5. A binary logic circuit as claimed in claim 2, the plurality of rows of the multiplier array being arranged such that the representations of the integer variable x at those rows are collectively truncated by a set of Δ least significant digits, the set of Δ least significant digits being substantially the largest number of least significant digits that can be discarded without causing the multiplier array to deviate from the true rounded value of $$\frac{px}{q}$$

for any x between 0 and M.

6. A binary logic circuit as claimed in claim 5, wherein the fixed integer b is the integer having the smallest Hamming weight which satisfies said operation for all x.

7. A binary logic circuit as claimed in claim 6, wherein, in the case that (a) is satisfied by a smaller integer k than (b), if there is more than one value of b having the same smallest Hamming weight, the fixed integer b is the smallest value of b.

8. A binary logic circuit as claimed in claim 1, the multiplication logic making use of a canonical signed digit representation.

9. A binary logic circuit as claimed in claim 2, the multiplier array being unable to perform multiplication by a variable.

10. A binary logic circuit as claimed in claim 1, the binary logic circuit being configured to determine the rounded value of $$\frac{px}{q}$$

according to any one of the following rounding schemes: round towards zero (RTZ), round towards negative infinity (RTN), round towards positive infinity (RTP), and round towards nearest with ties to upper (RTU).

11. A machine readable storage medium having encoded thereon non-transitory machine readable code for generating a binary logic circuit according to claim 1.

12. A fixed point filter comprising one or more binary logic circuits configured as claimed in claim 1.

13. A method of deriving a hardware representation of a binary logic circuit configured to determine, for an input value x, a rounded value of $$\frac{px}{q}$$

by implementing the operation $$\frac{ax+b}{2^k},$$

where p and q are coprime constant integers with p<q and q≠$2^i$, i is an integer, input value x is an integer variable between 0 and integer M where M≥2q, and a, b and k are fixed integers, the method comprising:
  determining, in dependence on the values of p and q, the integer k as the smallest integer that satisfies either:

$$\frac{2^k}{(p2^k)\bmod q} > q\left\lfloor\frac{M}{q}\right\rfloor - q + p^{-1}; \text{ or} \quad (a)$$

$$\frac{2^k}{(-p2^k)\bmod q} > M - ((M+p^{-1})\bmod q), \quad (b)$$

determining the fixed integers a and b such that:
    if (a) is satisfied by a smaller integer k than (b), calculating a as the integer given by $$\left\lfloor\frac{p2^k}{q}\right\rfloor$$

and selecting b from the set of one or more integers in the range $$\left[\left\lfloor\frac{M}{q}\right\rfloor((p2^k)\bmod q), \frac{2^k + (q-p^{-1})((p2^k)\bmod q)}{q} - 1\right],$$

and
    if (b) is satisfied by a smaller integer k than (a), calculating a as the integer given by $$\left\lceil\frac{p2^k}{q}\right\rceil$$

and selecting b from the set of one or more integers in the range $$\left[0, \frac{2^k - (M - ((M+p^{-1})\bmod q))((-p2^k)\bmod q)}{q} - 1\right];$$

and
    deriving, using the determined fixed integers a, b and k, a hardware representation for a binary logic circuit configured to implement the operation $$\frac{ax+b}{2^k}$$

by using multiplication and addition logic comprising a binary multiplier array configured to perform multiplication of x by the fixed integer a and being incapable of performing multiplication of x by a variable factor, the multiplication and addition logic further configured to perform addition of b.

14. A method as claimed in claim 13, wherein deriving the hardware representation for the binary logic circuit comprises implementing said operation using a binary multiplier array comprising the multiplication and addition logic, the binary multiplier array having a plurality of rows, a first subset of the plurality of rows being configured to perform multiplication by the fixed integer a, a second subset of the plurality of rows being configured to perform the addition of b, and the rounded value being the output of the multiplier array right-shifted by k binary digits.

15. A method as claimed in claim 14, further comprising modifying said hardware representation by truncating a set of Δ least significant digits from the plurality of rows, the set of Δ least significant digits being substantially the largest set of least significant digits that can be discarded without causing the operation implemented by the binary logic circuit to deviate from the true rounded value of $$\frac{px}{q}$$

for any x between 0 and M.

16. A method as claimed in claim 15, wherein the fixed integer b is selected to be the integer having the smallest Hamming weight that satisfies the truncated hardware representation for the binary logic circuit.

17. A method as claimed in claim 13, wherein the hardware representation is RTL, a hardware description language, or a gate-level description language.

18. A computer readable storage medium having encoded thereon non-transitory computer readable program code for generating a hardware representation according to the method of claim 13.

19. A method of manufacturing an integrated circuit, the method comprising fabricating a binary logic circuit, derived according to the method as claimed in claim 13.

20. An integrated circuit manufactured according to the method of claim 19.

* * * * *